United States Patent [19]
Strawn

[11] Patent Number: 5,517,521
[45] Date of Patent: May 14, 1996

[54] METHOD AND APPARATUS FOR SYNCHRONIZATION BETWEEN REAL-TIME SAMPLED AUDIO APPLICATIONS OPERATING FULL-DUPLEX OVER A HALF-DUPLEX RADIO LINK

[75] Inventor: David F. Strawn, Marietta, Ga.

[73] Assignee: Digital Wireless Corporation, Atlanta, Ga.

[21] Appl. No.: 81,939

[22] Filed: Jun. 25, 1993

[51] Int. Cl.[6] .................................................. H04B 1/38
[52] U.S. Cl. .......................... 375/219; 375/357; 375/372; 370/24; 370/103; 370/105.3
[58] Field of Search ................................ 375/118, 7, 107, 375/219, 356, 259, 357, 372; 370/102, 108, 26, 32, 31, 24, 31, 103, 105.3; 307/520, 527

[56] References Cited

U.S. PATENT DOCUMENTS

| | | | |
|---|---|---|---|
| 4,716,575 | 12/1987 | Douros et al. | 370/108 |
| 4,780,890 | 10/1988 | Kane | 370/102 |
| 4,805,198 | 2/1989 | Stern et al. | 375/118 |
| 4,841,521 | 6/1989 | Amada et al. | 370/31 |
| 4,841,550 | 6/1989 | George et al. | 375/118 |
| 4,945,548 | 7/1990 | Iannarone et al. | 375/118 |
| 5,365,552 | 11/1994 | Astle | 375/118 |
| 5,367,534 | 11/1994 | Chou et al. | 375/118 |

*Primary Examiner*—Stephen Chin
*Assistant Examiner*—Amanda T. Le
*Attorney, Agent, or Firm*—Pollock, Vande Sande & Priddy

[57] ABSTRACT

A method and apparatus for synchronization between an originating node and an answering node. Given the fact that it is impossible to expect that independent time bases at the originate and answer node will oscillate at exactly the same frequency, the time base at the answer node is constrained to maintain an average frequency which is identical to that established by the originate node. The answer node monitors the status of a buffer in respect of almost-full and almost-empty conditions. A binary timing control signal is generated which switches to one state in response to an almost-fill condition and switches to an opposite state in response to an almost-empty condition. When the buffer is in an almost-full state, the operating clock at the answer node is controlled so as to be slightly higher than the frequency established by the originate node. In this way, a buffer which is in an almost-full state will tend to be emptied more rapidly (by the answer node's clock) than it is filled from the originate node. On the other hand, when the buffer is in an almost-empty state, the operating clock (of the answer node) is controlled so as to be slightly lower than the clock established at the originate node. In this way, the answer node buffer will be emptied more slowly than it is being filled from the originate node. Since both nodes must actually be capable of both originate functions and answer functions, the clock at each is capable of operating at three different frequencies, the center frequency corresponding to originate node operation and the higher and lower frequencies are used in answer node operations. In a preferred embodiment, the pulse train output from an oscillator is subjected to deletion of a smaller or larger number of pulses-per-unit time. The high frequency operation (at an answer node) uses the unmodified pulse train from the oscillator. Originate node functions use the pulse train output from the oscillator which is processed by deleting a first number of pulses-per-unit time. The lower frequency operation (at an answer node) is implemented by processing the pulse train from an oscillator by deleting a larger number of pulses-per-unit time.

9 Claims, 4 Drawing Sheets

METHOD AND APPARATUS FOR SYNCHRONIZATION BETWEEN REAL-TIME SAMPLED AUDIO APPLICATIONS OPERATING FULL-DUPLEX OVER A HALF-DUPLEX RADIO LINK

DESCRIPTION

1. Technical Field

The present invention relates to radio communication and more particularly to achieving synchronization between a pair of transceivers operating full-duplex over a half-duplex radio link.

2. Related Application

Co-pending application Ser. No. 08/08/689, filed Jun. 25, 1993, now abandoned, discloses synchronization of transmit and receive events in a half-duplex "ping-pong" radio link and is assigned to the assignee of this application. The Subject matter of the referenced application is incorporated herein by this reference.

BACKGROUND

A common communication application is a pair of transceivers engaged in bidirectional communication. A recently popular application is in radio telephony or cellular radio. It is particularly efficient, both from the radio spectrum standpoint as well as equipping the transceivers, if the transceivers can operate on a common carrier frequency. Typically, however, the users are accustomed to full-duplex operation, where at least the appearance of "talking" and "hearing" simultaneously are supported. The radio carrier link between the transceivers is, however, a half-duplex link, i.e. at any instant of time, it can only carry a signal from one transceiver to the other. The perception of full-duplex operation can be achieved, however, by framing the communication and allocating half of each frame to transmissions of one of the two transceivers. In this fashion, each transceiver has an opportunity to transmit during the frame and by buffering the signals, the appearance of full duplex operation is supported.

In a system of the foregoing type, the design must take into account the fact that the system clocks in each of the two transceivers will necessarily differ, however slightly, in frequency, since no two independent time bases can be made to oscillate at exactly the same frequency. Even the smallest frequency discrepancy will eventually result in buffer overflow or underflow with consequent disruption of the communications. The present invention is directed at a method and apparatus for attaining coarse frequency lock between the synchronous data clocks in both of the transceivers, thereby avoiding buffer underflow or overflow.

SUMMARY OF THE INVENTION

One of the two transceivers engaged in the communications session will have originated the session, and is referred to as the originate node. The other of the transceivers is referred to as the answer node. At each end of the radio connection, timing is derived from an oscillator. The oscillator employed in the originate node operates at a fixed frequency, designated $F_{ctr}$. The oscillator at the answer node warbles between a first frequency $F_{hi}$, slightly higher than $F_{ctr}$, and a lower frequency $F_{Lo}$, slightly lower than $F_{ctr}$. The difference between $F_{hi}$ and $F_{ctr}$ is referred to as df.

A receive buffer, or FIFO, in the answer node is equipped to generate Almost Full and Almost Empty signals. These signals are coupled to Set and Reset inputs of a latch or flip-flop so that the latch is alternately set when the FIFO is almost full and cleared when almost empty. The answer node generates a clock at $F_{hi}$. The required clock, at $F_{Lo}$, is generated by "swallowing" (or inhibiting) selected pulses from the $F_{hi}$ clock train. The output of the latch is used to control the "swallowing" of $F_{hi}$ clock pulses to derive the other clock rate $F_{Lo}$. The clock rate $F_{Lo}$ is lower than $F_{ctr}$ by the amount df. Thus, the output of the pulse swallower is a clock which is made to run at $F_{hi}$ when the answer node receive FIFO trips the Almost Full indicator and slows to $F_{Lo}$ when the receive FIFO trips the Almost Empty indicator. When the receive FIFO is nearly full and the answer node clock goes to $F_{hi}$, the accelerated clock speed increases the rate at which samples are extracted from the receive FIFO, tending to empty the receive FIFO. Similarly, when the FIFO is almost empty, the answer node clock, running at $F_{Lo}$ slows the rate at which samples are extracted, tending to fill the receive FIFO. The receive FIFO contents slowly expands and contracts cyclically, averting overflow and underflow conditions which would result in disruption of the isochronous data flow. The answer node clock which directs both the extraction of data from the receive FIFO and the loading of data into the transmit FIFO is derived from the "warbled" clock.

The fact that fixed-length data frames are exchanged, one-for-one, and all frames contain either exactly or substantially the same number of bits, requires the amount of data received be the same as that which is transmitted. For this reason, audio in both transmit and receive sections of the originate node are clocked at the fixed frequency $F_{ctr}$. Sampling in both transmit and receive sections of the answer node are likewise clocked at the same average rate by alternating the instantaneous rate between the two rates, one slightly higher ($F_{hi}=F_{ctr}+df$) and one slightly lower ($F_{Lo}=F_{ctr}-df$), than the originate node clock frequency, $F_{ctr}$. By monitoring the unused capacity of the answer node receive FIFO, the answer node receiver is clocked at a variable rate which, on average, is made to equal the clock rate of the originate node, $F_{ctr}$.

The choice of an optimal frequency variation df is influenced by the time base hardware, with more accurate time bases permitting smaller frequency differences. A small frequency difference (df) is desirable to prevent the deviation and sampling frequency from being discernible in the recovered audio. In the answer node, the rate at which the time base alternates between $F_{hi}$ and $F_{Lo}$ is slow, typically measured in seconds if the time base oscillators are crystal controlled. The rate shifts are much too slow to result in frequency artifacts or beat notes which might affect audio fidelity in a fast tracking system.

The foregoing discussion has distinguished between the equipment housed within and the operation of the originate node from the equipment housed within and the operation of the answer node. In a practical application, however, which of two transceivers originates a session (and hence becomes the originate node) and which of the two answers the originator's request for communication (and becomes the answer node) is completely arbitrary. Accordingly, a transceiver must be capable of both originate node and answer node operation. Accordingly, each of the transceivers includes a crystal oscillator running at the high rate, $F_{hi}$. The pulse swallower which has been referred to is present in both the originate and answer node transceivers. In the originate node transceiver, the pulse swallower operates by swallowing pulses at a relatively low rate to generate the frequency $F_{ctr}$. In the answer node, however, the pulse swallower operates (at times) at a higher rate to generate the frequency $F_{Lo}$. For example, in one embodiment of the invention, the crystal oscillator operates at 10.7525 MHz. In the originate node, one pulse of every 21,505 pulses is swallowed to generate $F_{ctr}$ of 10.7520 MHz. In the answer node, when the pulse swallower operates, it swallows one pulse of every 1,752 to generate $F_{Lo}$ of 10.7515 MHz. Thus, in this embodiment df is 500 Hz. A crystal oscillator is employed which is accurate to within a few hundred hertz without temperature compensation under anticipated worst case conditions. During manufacture, the oscillator is aligned to within a few hertz of the design frequency. Crystal frequency should not vary by more than 10 ppm. The concern for synchronization is based on a relative frequency separation; if each can vary by 10 ppm, then the maximum anticipated deviation between two units should be 20 ppm. At 10 MHz this corresponds to 200 Hz. With a maximum deviation of 200 Hz, a frequency deviation df of 500 Hz was chosen.

In accordance with the invention then, a communication system includes controlling (originate) and controlled (answer) transceivers, wherein each transceiver alternately transmits and receives data packets of substantially equal information content. The controlling transceiver includes a clock source providing timing for unloading a transmit buffer and for loading a receive buffer. The controlled transceiver includes a controlled clock source providing at a controlled clock terminal, timing pulses for unloading a transmit buffer and loading a receive buffer, the receive buffer includes means generating Almost Full and Almost Empty signals. The controlled clock source includes a bistable means responsive to the Almost Full and Almost Empty signals for generating a binary timing control signal which switches to one state in response to receipt of the Almost Full signal and switches to an opposite state in response to the Almost Empty signal. A clock source is included in the controlled transceiver producing timing pulses at a clock output. Finally, control means is responsive to the clock output and to the binary timing signal for passing the timing pulses from the clock output to the controlled clock terminal when the binary timing control signals is in one state and for deleting timing pulses at a given rate from the clock output to pass a reduced rate stream of timing pulses to the controlled clock terminal when the binary timing control signal is in the opposite state.

In accordance with another aspect, the invention provides a method of synchronizing a node of a pair of nodes cooperating in a synchronous full-duplex communications system over a half-duplex communication link, wherein each of the nodes alternately transmit and receive frames of equal data content with the use of transmit and receive first in-first out buffers, the method comprising the steps of:

(a) controlling a rate of transmission and reception at a first node through a first clock of a first fixed rate;

(b) at the other node:

(b1) initially controlling a rate of transmission and reception through a second clock of a second rate, slightly higher than the first fixed rate;

(b2) detecting an almost empty status of a receive first in-first out buffer, and in response:

(b3) reducing the rate of the second clock to a third rate, slightly lower than the first fixed rate.

BRIEF DESCRIPTION OF THE DRAWINGS

The present invention will now be described in further detail so as to enable those skilled in the art to make and use the same in the following portions of this specification when taken in conjunction with the attached drawings, in which.

DETAILED DESCRIPTION OF A PREFERRED EMBODIMENT

Figure 1:
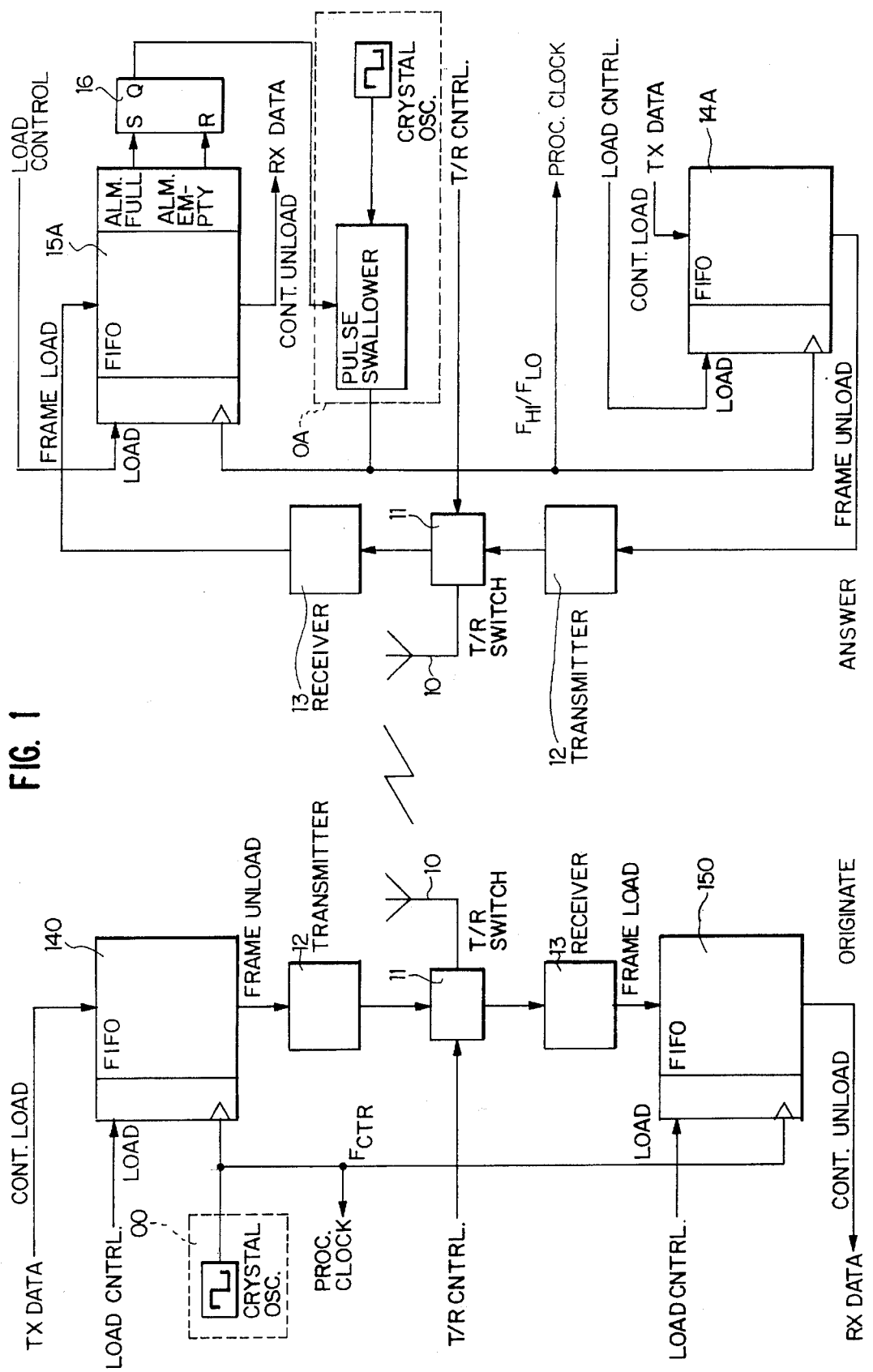
FIG. 1 is a functional block diagram of the operative components of a pair of transceivers cooperating in a typical session.

FIG. 1 is a functional block diagram of the apparatus employed in accordance with the present invention. FIG. 1 shows a communications session taking place between an originate node (at the left) and an answer node (at the right). Each node includes a transmit antenna 10, a T/R switch 11, a transmitter 12, and a receiver 13. The originate node includes a transmit FIFO 140 and a receive FIFO 150. Likewise, the answer node includes a transmit FIFO 14A and a receive FIFO 15A. The process clock for system timing at the originate node establishes a rate $F_{ctr}$ controlled by an oscillator OO shown in dotted outline in FIG. 1. On the other hand, the process clock at the answer node is either at the rate $F_{hi}$ (which is greater than $F_{ctr}$ by the amount df) or at the rate $F_{Lo}$ (which is lower than the rate $F_{ctr}$ by df), as established by the answer node oscillator OA which includes the pulse swallower shown in dotted outline in FIG. 1.

Figure 2:
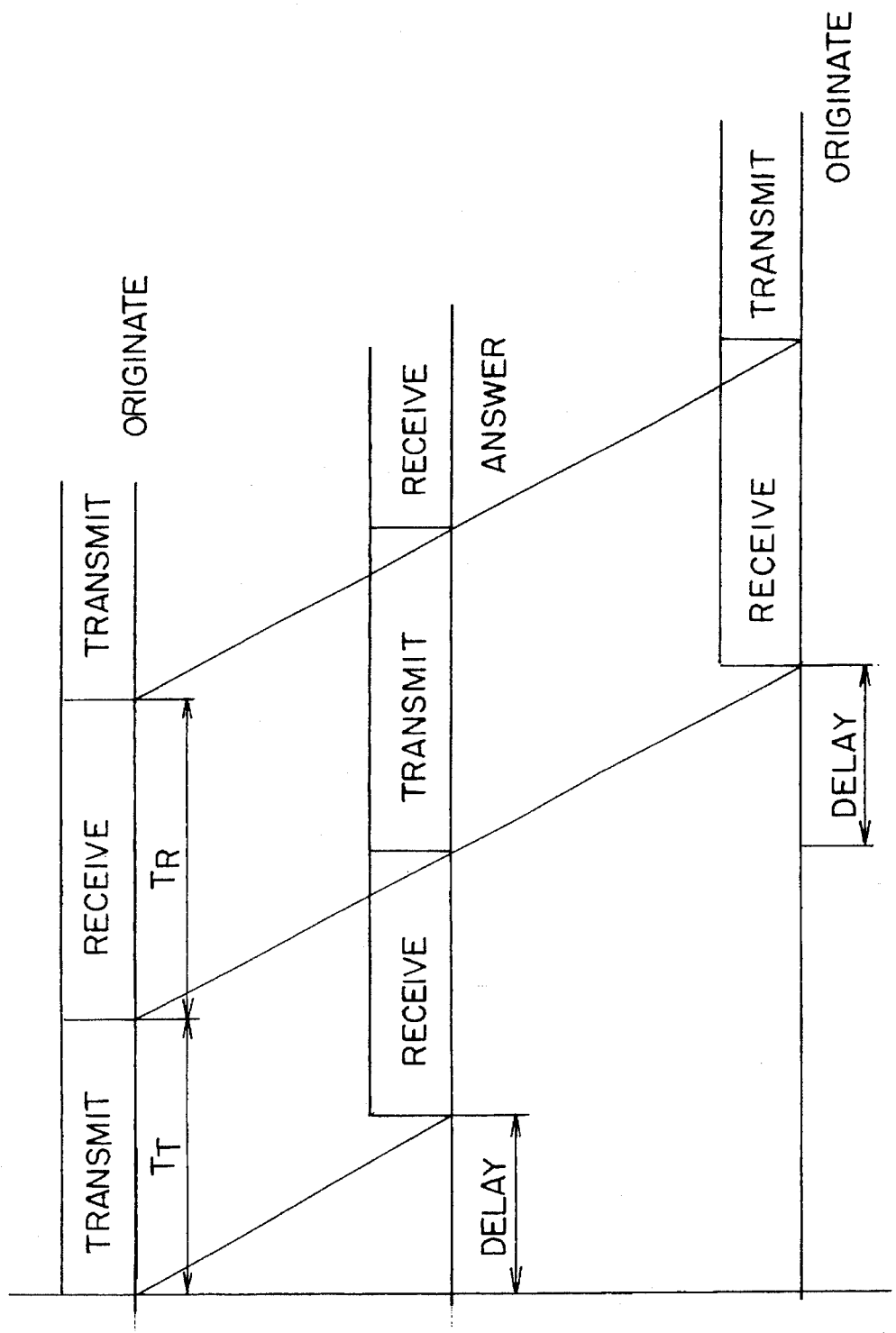
FIG. 2 is a typical timing diagram showing the transmit and receive frames at a typical node.

FIG. 2 shows the transmission frame format. As indicated in the upper line, the originate node initiates transmissions by alternately transmitting and receiving for respective periods $T_t$ and $T_r$. As shown in the second line in FIG. 2, the cadence imposed at the originate node is imposed on the answer node which alternately receives and transmits for like periods. Finally, transmissions from the answer node are received at the originate node as shown in the third line of FIG. 2.

Although the data which is respectively transmitted and received is buffered at both of the nodes, all the data which is transmitted by the originate node must be received and processed through the answer node and likewise the data transmitted by the answer node must be received and processed by the originate node. For this reason, in order to avoid buffer underflow or overflow, the effect of clocks used at the respective originate and answer nodes must be, at least on average, identical.

As has been briefly described above, whereas the originate node operates at a constant rate established by the oscillator OO outputting a clock rate $F_{ctr}$, the answer node operates with a process clock established by the oscillator OA which switches between rates $F_{hi}$ and $F_{Lo}$. More particularly, the answer node will initially come up with the process clock operating at $F_{hi}$. As a consequence, the answer node will tend to empty the receive FIFO 15A. The emptying of the receive FIFO 15A will result in the Almost Empty signal being asserted, resetting the bistable latch 16. The resulting command to the pulse swallower contained in the oscillator OA will cause the process clock to switch to $F_{Lo}$. As has been noted, $F_{Lo}$ is less than the rate ($F_{ctr}$) used at the originate node. As a consequence, after some period of time the Almost Full signal will be asserted at the receive FIFO 15A. The bistable latch 16 responds to the assertion of the Almost Full signal by changing the state of its output signal to the oscillator OA. This will have the effect of changing the process clock rate back to $F_{hi}$. The foregoing process will continue maintaining the receive FIFO at a point between its almost full and almost empty conditions and thus avoiding buffer overflow or underflow.

Figure 3:
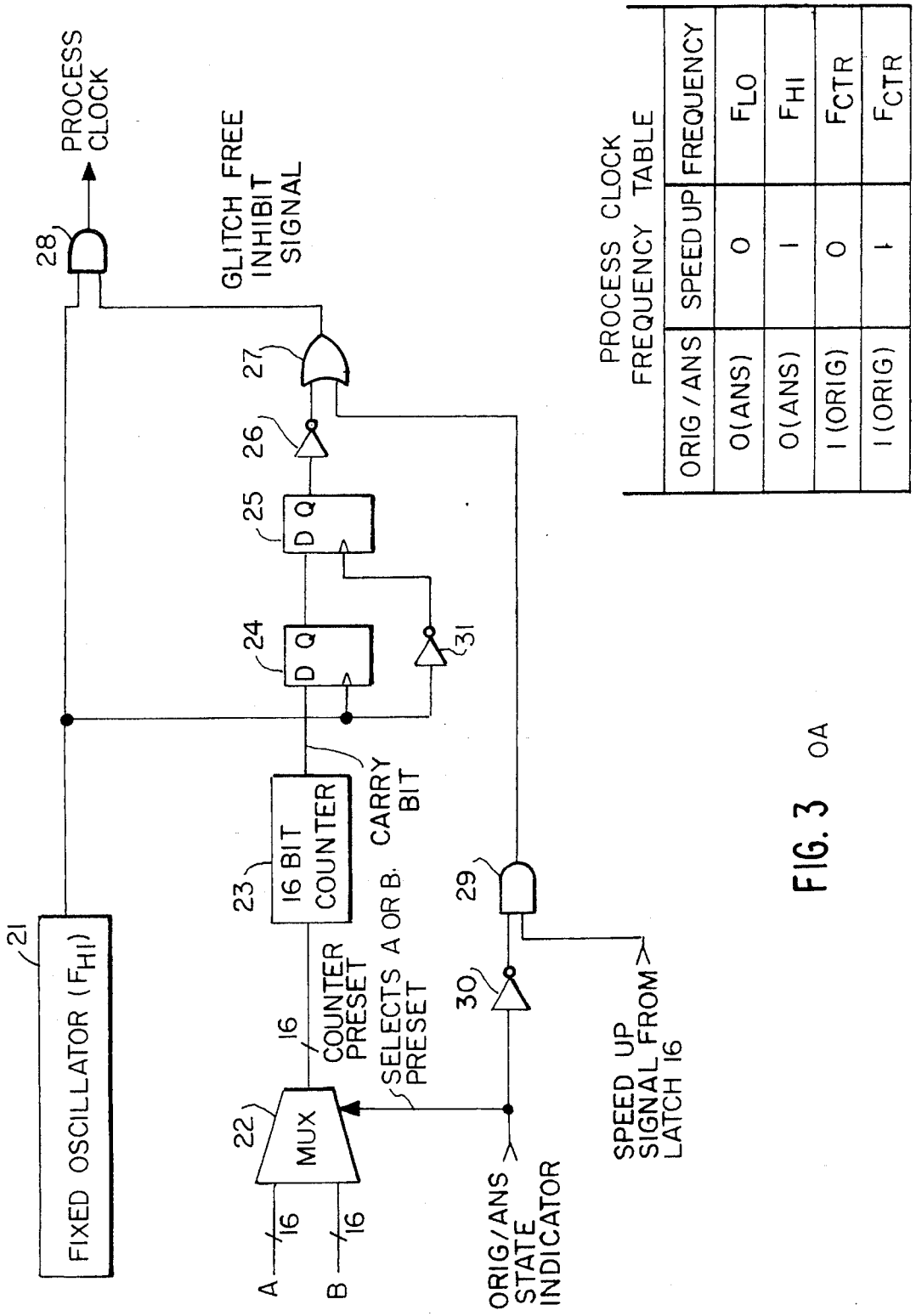
FIG. 3 is a block diagram of the pulse swallower and its associated circuitry.

FIG. 3 is a detail illustrating the actual form of the oscillator OA at an answer node as well as the oscillator OO at the originate node. More particularly, as shown in FIG. 3, a fixed oscillator 21 (operating at the rate $F_{hi}$) provides a clock rate input to an AND gate 28, the output of which is the process clock at both the originate and answer nodes. 16-bit counter presets A and B are provided to inputs of a multiplexer 22. The output of the multiplexer is provided as the counter preset input to a 16-bit counter 23. An originate/answer (ORIG/ANS) state indicator selects the A or B input of the multiplexer as the counter preset, depending upon the mode of operation of the node. The same signal is provided, through an inverter 30, as one input of an AND gate 29. The other input to the AND gate 29 is the output signal from the latch 16, the speed up signal. The output of AND gate 29 is one input to an OR gate 27. The carry bit of the 16-bit counter 23 is provided as the D input to a flip-flop 24 which is clocked by an output of the oscillator 21. The Q output of the flip-flop 24 is provided as the D input to flip-flop 25 which is clocked by an inverted form of the output of the oscillator 21, inverted by inverter 31. The Q output of flip-flop 25 is provided, via inverter 26, as the other input to the OR gate 27. Finally, the output of the OR gate 27 is the other input to the AND gate 28.

Figure 4:
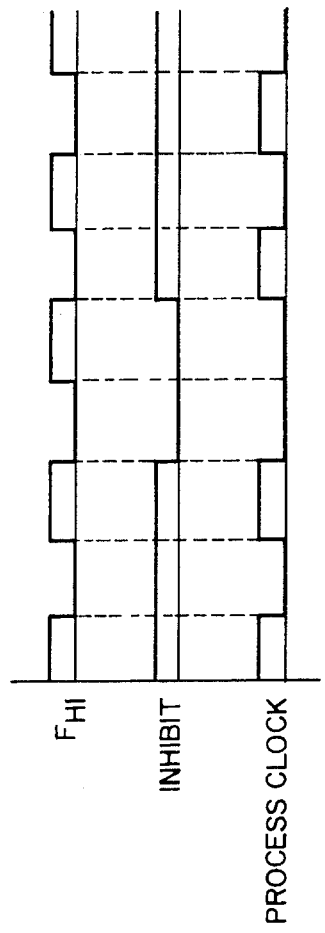
FIG. 4 illustrates the operation of the circuit of FIG. 3.

FIG. 4 is an illustration of the operation of the circuit illustrated in FIG. 3. More particularly, the upper line in FIG. 6 shows the output of the oscillator 21, i.e. $F_{hi}$. As shown in FIG. 6, when the output of the OR gate 27 is high, the output of the AND gate 28 is identical to the output of the oscillator 21. However, as is also shown in FIG. 6, when the inhibit signal goes low, the output of the AND gate 28 drops and remains low, i.e. it does not follow the output of the oscillator 21. The output of the AND gate 28, the process clock, picks up and begins following the output of the oscillator 21 when the inhibit signal again goes high.

It should be apparent that by controlling the rate of INHIBIT, the average rate of the process clock can be controlled. The table at the lower right-hand portion of FIG. 3 shows that when the inhibit signal is high (a high output from the latch 16), then the AND gate 28 does not block any of the output pulses from the oscillator 21 so that the process clock and the oscillator rate ($F_{hi}$) are identical.

When the ORIG/ANS state indicator is high (indicating originate), then the speed up signal has no effect since the inverter 30 inhibits the AND gate 29. In the originate mode, the counter is preset with a fixed number and every time a carry bit is output from the counter 23, the resulting signal inhibits a clock pulse of the oscillator 21. By controlling the quantity to which the counter is preset, the rate at which the INHIBIT signal is produced may be controlled. In a preferred embodiment of the invention, the counter 23 is preset so that one pulse out of every 21,505 pulses is inhibited, resulting in $F_{ctr}$ of 10.7520 MHz. On the other hand, when the ORIG/ANS state indicator is low (indicating the answer mode), the inverter 30 enables the AND gate 29 to follow the output of the speed up signal from the latch 16 and also selects the other preset. As a consequence, the inhibit signal does not occur so long as the speed up signal is high (indicating the receive FIFO is in an almost full condition). When the speed up signal is low (indicating that the receive FIFO is almost empty) then the inhibit signal is produced at a rate controlled by the counter preset. In an embodiment of the invention, that counter preset is such as to inhibit one oscillator pulse of every 10,752 producing a rate $F_{Lo}$ of 10.7515 MHz.

Figure 5:
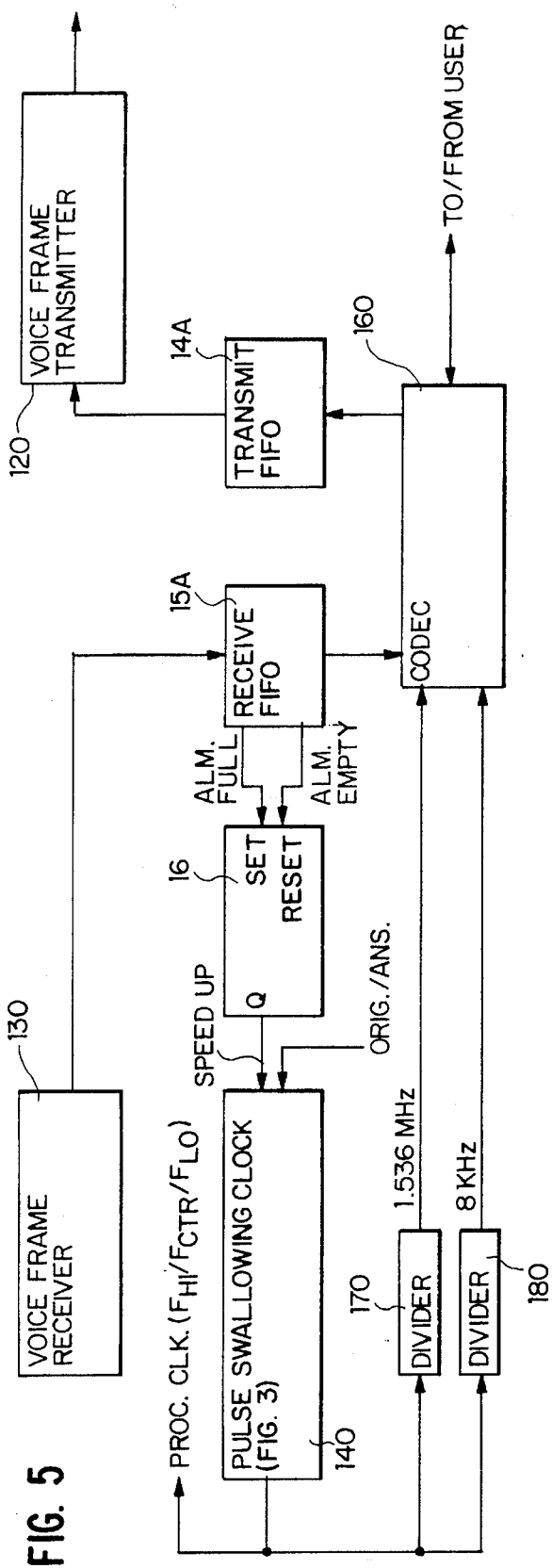
FIG. 5 shows the apparatus of the invention in relation to associated circuitry of the transceiver.

FIG. 5 illustrates application of the invention in a particular implementation which is described in more detail in the copending application identified above. More particularly, as shown in FIG. 5, a voice frame receiver provides digitized audio to the receive FIFO 15A. The full/empty status of the receive FIFO 15A is reflected in the almost full and almost empty signals which are provided as inputs to the bistable latch 16. The Q output of the latch 16 is the speed up signal which has been described hereabove and which is provided as an input to the pulse swallowing clock 140 which is shown in detail in FIG. 3. The output of the pulse swallowing clock, as has been described, is a selected clock of either $F_{hi}$, $F_{ctr}$ or $F_{Lo}$. Which clock rate is produced by the pulse swallowing clock 140 is determined by the state of the speed up signal and the state of the ORG/ANS signal indicating whether the node is acting as an originate node or acting as an answer node. The process clock output from the pulse swallowing clock 140 is provided to, among other places, the receive FIFO 15A in order to load that buffer and also to the transmit FIFO 14A in order to unload that buffer. As shown in FIG. 5, the transmit FIFO 14A provides an input to the voice frame transmitter 120.

A codec 160 is provided and is coupled between the user on the one hand and the buffers 15A and 14A on the other hand. More particularly, as those skilled in the art will understand, the codec 160 receives digitized audio from the receive FIFO 15A (output at a constant rate) and employing a digital-to-analog converter generates analog audio which is provided to the user. The codec 160 is also responsive to analog audio signals representing the speech of the user and using an internal analog-to-digital converter, converts that audio to digitized audio which is provided as an input to the transmit FIFO 14A. Those skilled in the art will understand that the rate at which the transmit FIFO 14A is loaded is constant. In order to operate the codec 160, two sets of clocks are provided by dividers 170 and 180 which are driven from an output of the pulse swallowing clock 140. As shown in FIG. 5, the codec 160 operates with a 1.536 MHz and a 8 KHz clock.

While a particular example of the invention has been described hereinabove, it should be apparent from the foregoing that many changes can be made within the spirit and scope of the invention which is to be construed in accordance with the claims attached hereto and not to be limited by this particular example.

I claim:

1. A communication system comprising controlling and controlled transceivers wherein each transceiver alternately transmits and receives data packets of equal information content, a) the controlling transceiver including a clock source providing timing for unloading a transmit buffer and for loading a receive buffer, b) the controlled transceiver including a controlled clock source providing, at a controlled clock terminal, timing pulses for unloading a transmit buffer and loading a receive buffer, said receive buffer including means for generating almost full and almost empty signals, said controlled clock source including:

b1) bistable means responsive to said almost full and almost empty signals for generating a binary timing control signal which switches to one state in response to receipt of the almost full signal and switches to an opposite state in response to the almost empty signal, b2) a clock source producing timing pulses at a clock output, and b3) control means responsive to said clock output and to said binary timing signal for passing said timing pulses from said clock output to said controlled clock terminal when said binary timing control signal is in said one state and for deleting timing pulses at a given rate from said clock output to pass a reduced rate stream of timing pulses to said controlled clock terminal when said binary timing control signal is in said opposite state.

2. A communication system as recited in claim 1 wherein said clock source of said controlling transceiver operates at a rate $F_{ctr}$ and said controlled clock source of said controlled transceiver operates at a rate $F_{Hi}$, where $F_{Hi>Fctr}$.

3. A communication system as recited in claim 1 wherein said clock source of said controlling transceiver operates at a rate $F_{ctr}$ and said controlled clock source of said controlled transceiver operates at a rate $F_{Hi}$, where $F_{Hi}>F_{ctr}$, and wherein said reduced rate stream of timing pulses is at a rate $F_{Lo}$, selected so that $F_{Hi}>F_{ctr}>F_{Lo}$.

4. A full duplex audio communication system operating over a half duplex communication link comprising first and second transceivers wherein each transceiver alternately transmits and receives sampled audio packets of equal information content, a) said first transceiver including:

a1) a first receive buffer, a first transmit buffer, a clock source providing timing for unloading said first transmit buffer and for loading said first receive buffer, a2) means for sampling an audio signal and for continuously loading said first transmit buffer, a3) means for continuously unloading said first receive buffer and for generating an audio signal therefrom, b) said second transceiver including:

b1) a second receive buffer, a second transmit buffer, a controlled clock source providing, at a controlled clock terminal, timing pulses for unloading said second transmit buffer and loading said second receive buffer, said second receive buffer including means generating almost full and almost empty signals, said controlled clock source including:

b11) bistable means responsive to said almost full and almost empty signals for generating a binary timing control signal which switches to one state in response to said almost full signal and switches to an opposite state in response to said almost empty signal, b12) a clock source producing timing pulses at a clock output, and b13) control means responsive to said clock output and to said binary timing control signal for passing said timing pulses from said clock output to said controlled clock terminal when said binary timing control signal is in said one state and for deleting timing pulses at a given rate from said clock output to pass a reduced rate stream of timing pulses to said controlled clock terminal when said binary timing control signal is in said opposite state, b2) means for sampling an audio signal and for continuously loading said second transmit buffer, and b3) means for continuously unloading said second receive buffer and for generating an audio signal therefrom.

5. A full duplex audio communication system operating over a half duplex communication link as recited in claim 4 wherein said clock source of said first transceiver operates at a rate $F_{ctr}$ and said clock source of said second transceiver operates at a rate $F_{Hi}$, where $F_{Hi}>F_{ctr}$, and wherein said reduced rate stream of timing pulses is at a rate $F_{Lo}$, selected so that $F_{Hi}>F_{ctr}>F_{Lo}$.

6. A method of synchronizing a node of a pair of nodes cooperating in a synchronous full duplex communication system over a half duplex communication link, wherein each of said nodes alternately transmit and receive frames of equal data content with the use of transmit and receive first in first out buffers, said method comprising the steps of:

a) establishing a rate of transmission and reception at a first node through a first clock of a first fixed rate, b) at the other node, b1) initially controlling a rate of transmission and reception through a second clock of a second rate, slightly higher than said first fixed rate, b2) detecting an almost empty status of a receive first in first out buffer, and in response b3) reducing a rate of said second clock to a third rate, slightly lower than said first fixed rate.

7. A method as recited in claim 6 which includes the further steps, at said other node of:

b4) detecting an almost full state of said receive first in first out buffer, and in response b5) terminating said clock rate reduction to return the rate of said second clock to said second rate.

8. A method of synchronizing a node of a pair of nodes cooperating in a synchronous full duplex communication system over a half duplex communication link, wherein each of said nodes alternately transmit and receive frames of equal data content with the use of transmit and receive first in first out buffers, said method comprising the steps of:

a) establishing a rate of transmission and reception at a first node through a first clock of a first fixed rate, b) at the other node, b1) initially controlling a rate of transmission and reception through a second clock of a second rate, slightly higher than said first fixed rate, b2) detecting an almost empty status of a receive first in first out buffer, and in response b3) reducing a rate of said second clock to a third rate, slightly lower than said first fixed rate, b4) detecting an almost full state of said receive first in first out buffer, and in response b5) terminating said clock rate reduction to return the rate of said second clock to said second rate.

9. A method as recited in claim 6 or in claim 8 wherein said step of reducing a rate of said second clock comprises;

i) providing a clock of fixed rate equal to said second rate, and ii) reducing a rate of said second clock by deleting a fixed number pulses from said second clock per unit time to produce a clock at said third rate.

* * * * *